US006185718B1

(12) United States Patent
Dell et al.

(10) Patent No.: US 6,185,718 B1
(45) Date of Patent: Feb. 6, 2001

(54) MEMORY CARD DESIGN WITH PARITY AND ECC FOR NON-PARITY AND NON-ECC SYSTEMS

(75) Inventors: Timothy J. Dell, Colchester, VT (US); Kamal E. Dimitri, Tuscon, AZ (US); Kent A. Dramstad, Essex Junction, VT (US); Marc R. Faucher, So. Burlington, VT (US); Bruce G. Hazelzet, Essex Junction, VT (US); Bruce W. Singer, Richmond, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/032,195

(22) Filed: Feb. 27, 1998

(51) Int. Cl.[7] ..................................................... G06F 11/00
(52) U.S. Cl. ............................................ 714/800; 714/801
(58) Field of Search .............................. 714/773, 48, 767, 714/719, 781, 800, 805, 763, 801; 711/144; 710/66

(56) References Cited

U.S. PATENT DOCUMENTS

| 3,798,597 | * | 3/1974 | Frambs et al. ........................ 714/781 |
| 4,321,665 | * | 3/1982 | Shen et al. ............................. 710/66 |
| 5,068,851 |   | 11/1991 | Bruckert et al. ....................... 714/25 |
| 5,155,735 | * | 10/1992 | Nash et al. ............................ 714/800 |
| 5,289,477 |   | 2/1994 | Lenta et al. ........................... 714/758 |
| 5,379,304 |   | 1/1995 | Dell et al. ............................. 714/758 |
| 5,450,422 |   | 9/1995 | Dell ...................................... 714/773 |
| 5,452,429 |   | 9/1995 | Fuoco et al. ............................. 714/6 |
| 5,465,262 |   | 11/1995 | Dell et al. ............................. 714/802 |
| 5,481,552 | * | 1/1996 | Aldereguia et al. .................. 714/773 |
| 5,541,941 |   | 7/1996 | Dell et al. ............................. 714/802 |
| 5,757,817 | * | 5/1998 | Bolyn et al. .......................... 714/719 |
| 5,761,221 | * | 6/1998 | Baat et al. ............................ 714/767 |
| 5,774,647 | * | 6/1998 | Raynham et al. ...................... 714/48 |
| 5,832,250 | * | 11/1998 | Whittaker ............................. 711/144 |
| 5,914,970 | * | 6/1999 | Gunsaulus et al. ................... 714/805 |
| 5,923,682 | * | 7/1999 | Seyyedy ............................... 714/773 |
| 5,961,660 | * | 10/1999 | Capps, Jr. et al. .................... 714/763 |

* cited by examiner

Primary Examiner—Albert De Cady
Assistant Examiner—David Ton
(74) Attorney, Agent, or Firm—William N. Hogg

(57) ABSTRACT

A memory card design which adds parity for non-parity computer systems to supply error detection capabilities is provided. The apparatus includes a memory card, parity DRAM locatable on the memory card, logic for generating and checking parity bits and logic for the control of the generating, checking and storing parity bits. Also, in another embodiment, the apparatus adds error correction code to the memory card to provide error detection and correction code to systems lacking such capabilities.

26 Claims, 3 Drawing Sheets

MEMORY CARD DESIGN WITH PARITY AND ECC FOR NON-PARITY AND NON-ECC SYSTEMS

FIELD OF THE INVENTION

This invention relates generally to a memory system providing parity detecting capabilities for non-parity computer systems.

BACKGROUND OF THE INVENTION

The integrity requirements for personal computer systems have grown rapidly in the past few years. At the present time, newer operating systems and applications require a great deal of memory. Also, the amount of memory which can be accommodated in personal computer systems continues to increase rapidly. Such personal computer systems have in the past typically been provided only with the capability of writing and checking parity with many recent systems altogether eliminating parity. Computer memory comes in two basic forms: Random Access Memory (hereinafter RAM) and Read-Only Memory (hereinafter ROM). RAM is generally used by a processor for reading and writing data. ROM is generally used for storing data which will never change, such as the Basic Input/Output System (hereinafter BIOS).

Generally, RAM makes up the bulk of the computer system's memory, excluding the computer system's harddrive, if one exists. RAM typically comes in the form of dynamic RAM (hereinafter DRAM) which requires frequent recharging or refreshing to preserve its contents. Organizationally, data is typically arranged in bytes of 8 data bits. An optional 9th bit, a parity bit, acts as a check on the correctness of the values of the other eight bits. Within a computer system, it is important that data transmitted between the central processing unit, "CPU" and the memory is being transferred accurately. In order to ensure that data transmission is error free, a data transmission attribute known as parity may be used. Data is grouped together in 8 bit chunks called bytes. Error detection methods such as parity add additional data bits in order to verify if the data byte has been transmitted intact. With parity, an additional data bit, called a parity bit, is generated and added onto each data byte. The parity bit may be set to a 1 or 0 depending on the number of 1 data bits found in the byte. If even parity is selected, the parity bit that is added will make the total number of "1" bits in the byte equal an even number. However, if odd parity is selected, the parity bit that is added will make the total of "1" bits in the byte equal an odd number. In the case of either "even" or "odd" parity, if a memory bit is corrupted, the bad parity condition will be flagged, and generally, the system will crash when the error is detected. In the case of systems which do not write and check parity, corrupted data can cause malfunction of the system. Moreover, with the advent of large applications which normally require large amounts of memory, these are the most exposed to such crash and data corruption.

Many personal computers have the feature that additional memory can be added to the computer system. Typically, Dynamic Random Access Memory ("DRAM") can be added by a user who requires additional storage. A popular device for accomplishing an addition of DRAM is a memory card known as a Single Inline Memory Module ("SIMM"). A SIMM (Single Inline Memory Module) is a printed circuit board having, among other things, memory chips and connection points or pins. SIMMs are inserted into special sockets on the computer system's motherboard or memory carrier card. A central characteristic of SIMMs is that although there are connection pins on both sides of the SIMM's printed circuit board, these connections are not singular. That is, pin 1 on the front side of the printed circuit board is connected to pin 1 on the backside of the printed circuit board. Therefore, although most SIMMs have a total of 144 pins, only 72 are available for electrical connection.

A DIMM (Dual Inline Memory Module) is also a printed circuit board having, among other things, memory chips and connection points or pins. DIMMs are also inserted into special sockets on the computer system's motherboard or memory carrier card. However, the DIMM includes a dual row of contacts, one on each side of the printed circuit board, which are available for electrical contact. Most general DIMMs include a total of 168 pins, with 84 pins on the front side and 84 pins on the back side of the printed circuit board. Each pin is available for electrical contact.

Many computer systems do not provide means for error detection. Also, many of today's memory modules do not store parity bits. DRAM memory cards in non-parity systems can fail with no indication of where the problem is located being given to the operator. In other words, a DRAM on a SIMM or DIMM could fail, and the operator would be unable to determine which DRAM on the memory module is responsible for the failure. This failure of memory cards in a non-parity system can potentially create errors in operation, can cause system lock-up or both. Currently, a common solution when operation errors or system lock-up occur is to swap the entire system memory for a new system memory. This approach is wasteful and expensive, but since memory card failures are a primary source of computer system failures, it is quicker to swap an entire failed memory with a new memory than to systematically examine and determine which memory card in the memory system is causing the problem.

Furthermore, the typical memory chip has a 4, 8 or 16 bit wide data field. To add parity, such a system must use either a x9 chip or two x4 chips plus a x1 chip or any such equivalent of a x9 chip or x1 chip such as a quad CAS chip added as an extra chip. In an effort to reduce the number of chips needed for a computer system—which reduces cost, the extra chip required for parity is eliminated. Accordingly, SIMMs designed to accommodate a parity system are difficult to find, if not totally unavailable. Therefore, current systems can neither generate nor check parity, and the entire memory must be replaced when memory cards fail. Thus, a need exists for inline memory modules which accommodate parity and provide for indication of a failed module.

Due to the importance of insuring data is accurately transmitted between the CPU of a computer system and the system's memory, techniques other than parity can be used to ensure that data transmission is error free. One such technique is error correction code ("ECC"). ECC is similar to parity in that ECC takes the existing data and generates a special series of bits which code for what the data byte should be. In a system utilizing ECC, both single bit errors and double bit errors are detected. Furthermore, beyond merely detecting the errors as in a parity system, ECC can correct the errors during data transmission. Typically, ECC circuitry and logic is provided in the motherboard of a computer system, but many computer systems do not have ECC capabilities. Thus, a need exists for inline memory modules which generate ECC for non-ECC systems.

SUMMARY OF THE INVENTION

According to the present invention, a computer system and method of using the same is provided in which a memory card design adds parity error detecting capability to non-parity systems. The system includes SIMM or DIMM memory cards in which logic for generating and storing parity bits is provided along with a technique for indicating which module has failed. In one DIMM embodiment, controlling and decoding an error indicator to an EPROM is provided. Thus, while non-parity is becoming standard, the associated difficulties in detecting problems in memory cards is eliminated by logic for generating and storing parity. Also, logic is provided for controlling and decoding an error indicator to an EPROM in such embodiment. An indicator for indicating on which memory card the error occurred is provided.

In another embodiment, an inline memory module is provided with logic for generating error correction code in a non-error-correction code system. Furthermore, the data bits are checked against the check bits and corrected if an error occurred. In one embodiment a set of exclusive or ("XOR") gates are utilized to check and correct the data bits. Finally, in yet another embodiment the error indicator is a non-volatile indictor.

DETAILED DESCRIPTION OF THE INVENTION

The present invention can exist in any number of environments but will be described in the environment of an IBM Personal Computer using an Intel 80386 or 80486 microprocessor and with Dynamic Random Access Memory. Embodiments are provided of the present invention utilizing either single or dual inline memory modules. For purposes of this description, the system will be described as a CPU that does not have parity generation capabilities or error correction code ("ECC") logic contained within the CPU system. Also, it is understood that the computer system described has sockets for receiving inline memory modules.

Figure 1:
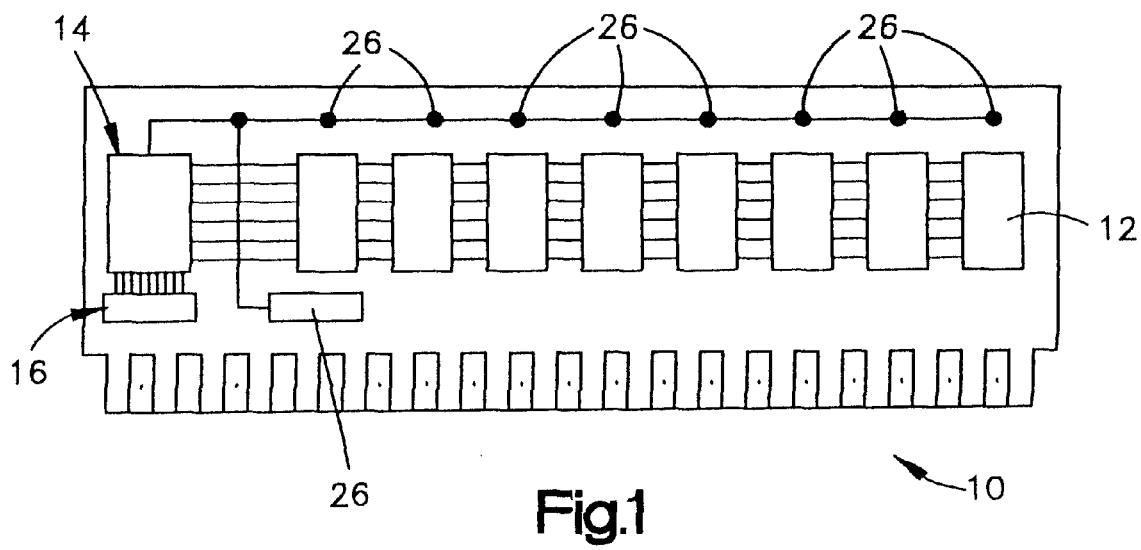
FIG. 1 is a schematic illustrating an embodiment of the present invention in which a SIMM has added parity.

As can be seen in FIG. 1, there is provided a SIMM 10 to provide the system with DRAM 12. The DRAM 12 is included on the SIMM 10 and is set at the same address depth as that provided to the SIMM 10. Also, logic circuity, seen generally at 14, is connected to the SIMM 10. This logic circuitry 14 performs the parity generator/check/controller function. A strobe controls the timing of the logic circuitry as data moves on and off the SIMM 10. In one embodiment the strobe is generated by a controller which utilizes the system control signals such as CAS. Also, parity information is stored in the additional parity RAM provided on the SIMM 10.

Figure 2:
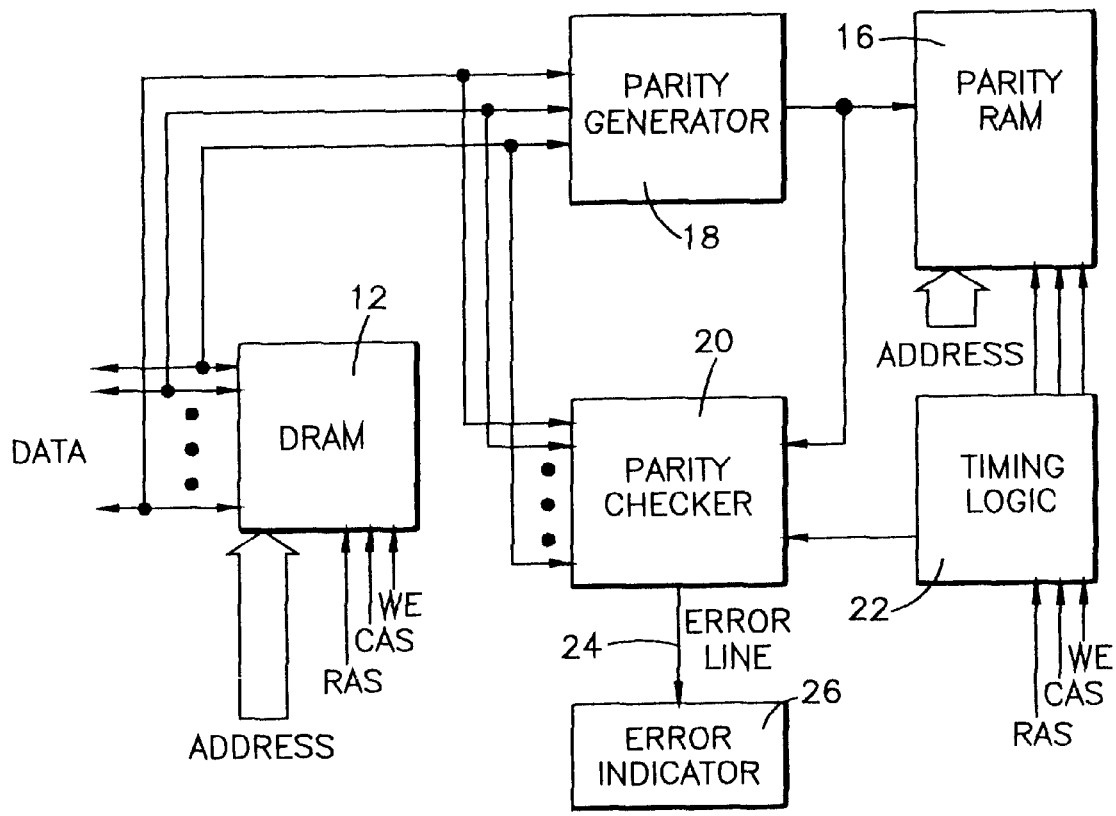
FIG. 2 is a block diagram illustrating the function of a SIMM with added parity.

FIG. 2 illustrates a functional block diagram of the SIMM 10 of FIG. 1 with added parity. As illustrated in FIG. 1, a plurality of DRAM 12 chips on the SIMM 10 are connected by lines to a parity generator/checker logic circuitry 14 which in turn is connected to a parity RAM 16 located on the SIMM 10. The parity generator 18 logic generates parity information which is checked by the parity checker 20 logic. Timing logic 22 controls the logic circuitry 14 as data moves on and off the SIMM 10. The necessary signals for the timing logic 22 are provided by the computer system. The signals include Row Activation Strobe ("RAS"), Column Activation Strobe ("CAS") and Write Enable ("WE").

The parity checker 20 alerts the system operator of a parity error by generation of an error signal onto an error line 24. The error signal actuates an error indicator 26 to alert the system operator that an error occurred. Also, the error signal indicates the DRAM chip upon which the error occurred. As best seen in FIG. 2, a parity generator 18 is provided. The parity generator 18 operates to generate a parity bit. The parity generator 18 is in communication with parity RAM 16. The parity generator 18 operates to generate a parity bit which is stored in the parity RAM 16 locatable on the SIMM 10. To determine if a parity error has occurred, the parity checker 20 compares the parity bit with the data bit. If an error has occurred, the error line 24 is activated. The error line is in communication with the error indicator 26 so that if the error line 24 is activated, the error indicator 26 is activated.

Figure 5:
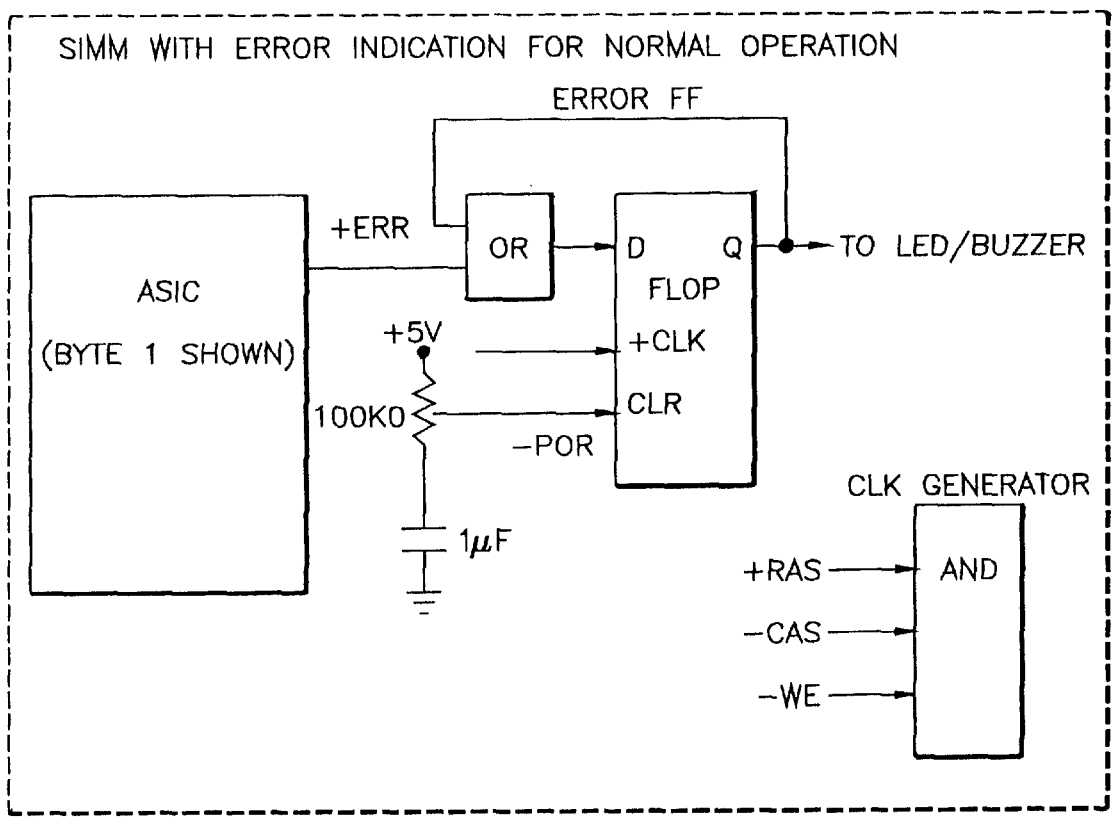
FIG. 5 is a block diagram illustrating the latching mechanism of the present invention.

In one embodiment, the error indicator 26 is an on-board buzzer. When the error signal actuates the buzzer, audible noise is emitted alerting the system operator that an error has occurred. The system operator can then determine on which module the error has occurred by an LED or other electronic or mechanical indicator. Thus, the system operator is notified of an error by the audible buzz and on which module the error occurred by the LED indicator. When the LED indicator is activated, the error signal is latched so that the LED remains illuminated until the power-on-reset ("POR") is activated. As seen in FIG. 5, when the LED indicator is activated, the error line 24 is latched so that it remains active through each clock cycle until the POR's reset. Once, the POR is activated, the latch clears, the error indicators are turned off and will not turn on until activated by the error lines at which time the latch re-activates.

Figure 3:
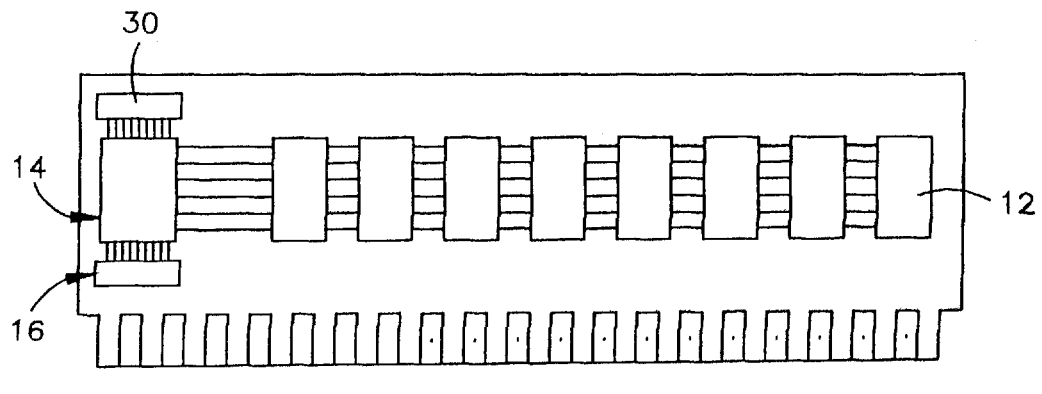
FIG. 3 is a schematic of the present invention illustrating a DIMM embodiment with added parity.

In another embodiment, as shown in FIG. 3, an embodiment utilizing a DIMM 28 is provided. This embodiment operates in a manner similar to the SIMM embodiment, described above, with an additional capacity of using available memory in a Serial EPROM 30. As in the SIMM embodiment, logic for generating and checking parity is included on the DIMM 28 along with added DRAM 12 to store the parity information. Thus, the memory in the on-board serial EPROM 30 is used to store any error information generated by the parity or ECC logic. This allows a cheaper implementation of parity or ECC in a non-parity system by providing a means of relaying error information without the addition of the electrical or electro-mechanical indicators utilized in the SIMM embodiment.

Figure 4:
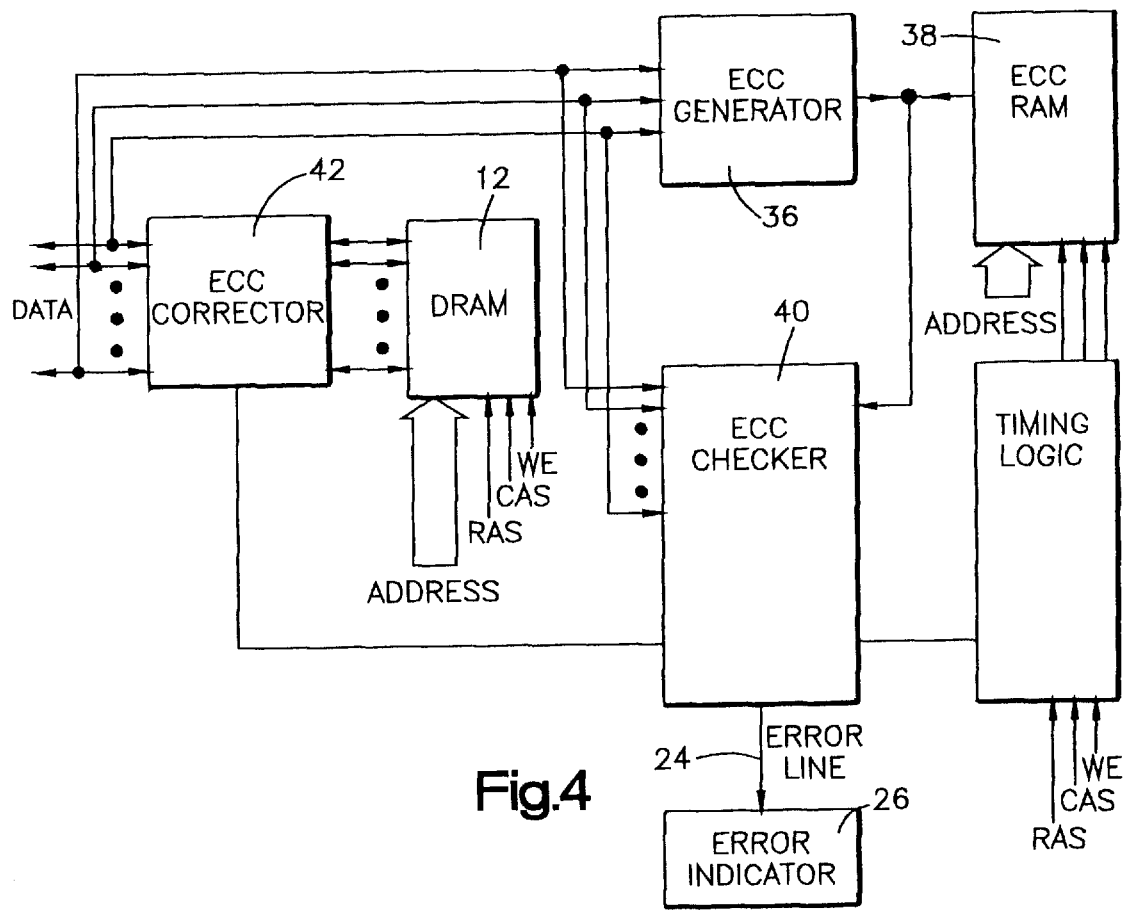
FIG. 4 is a block diagram illustrating the function of a SIMM with added error correction code.

In yet another embodiment, Error Correction Code is provided so that non-ECC, non-error-line monitoring parity systems can detect errors corrected and notify the user that such errors have occurred and have been corrected. As seen in FIG. 4, a SIMM is provided with error indication and correction capabilities. A clock generator is included to provide timing logic 22 for the ECC so that when an error is detected, an error latching mechanism, as illustrated in FIG. 5, can retain that an error occurred. The error latching mechanism is used because the error line is continually reset during any read cycle so that any new errors can be detected and indicated. Thus, by employing a latching mechanism as part of the error correction, when an error occurs on a SIMM, the existence of this error is retained in the latching mechanism as long as the latching mechanism is not re-set.

As seen in FIG. 4, an ECC generator 36 is provided in communication with ECC RAM 38. The ECC generator 36 is also in communication with the ECC checker 40 which is in communication with an error indicator 26. Also, an ECC corrector 42 is provided so that once errors are detected such error may be corrected.

As stated previously, FIG. 5 illustrates that the error line 24 includes a latching mechanism. The error line 24 is latched so that the indication of an error is retained with the system. This latching mechanism is utilized in both the parity and ECC embodiments of the present invention, but will be described only in terms of the the ECC environment. It should be understood, however, that the latching mechanism functions in an identical manner to that described below when operating in the parity embodiments.

During any read cycle after power on reset (POR) has occurred, if an error has been detected, the error line is latched. The error line is latched because it is constantly reset during any given read cycle so that a new error may be indicated if one occurs. Once an error is detected, the corresponding error indicator remains on until POR occurs. Thus, while new errors may be detected during new read cycles, previous detected errors are still indicated by the system.

The error line 24 is connected to an error indicator 26. Once an error is detected by the ECC checker 40, the error line 24 activates the error indicator 26. As stated above, due to the latching mechanism, once the error indicator 26 is activated, the indicator 26 remains activated until POR occurs. The indicator can be a volatile indicator such as a light emitting diode (LED) or buzzer or a non-volatile indicator such as a pop-out pin, plunger, colorstrip or a plug connector driven by an analog driver for a remote indicator that can be placed outside the computer. Since the error line 24 is latched, the user can open the PC console at any time before POR to examine the indicators so that the user can determine which SIMM(s) has had errors corrected. Furthermore, in one embodiment, an optional reset switch is provided to reset the error indicator without POR occurring. This reset is advantageous when multiple SIMMs have had their respective error indicators activated by providing a means of selectively resetting each SIMM to aid in isolating which SIMMs are causing the most or worst errors.

Once the ECC checker 40 detects an error and the error indicator is activated, an ECC corrector 42 is provided to correct the faulty data bit. As seen in FIG. 4, the data bits on a SIMM are sent to the ECC corrector as are the corresponding ECC bit. The correct has exclusive or ("XOR") gates to which the respective bits are sent. Each data bit is compared to its corresponding ECC bit. If an error has occurred, the data bit is corrected by the XOR gate and passed to the system. If no error has occurred the data bit is simply passed to the system with no correction taking place.

While the present invention has been illustrated by the description of the embodiments thereof, and while the embodiments have been described in considerable detail, it is not the invention of the applicants to restrict or in any way limit the scope of the appended claims to such detail. Additional advantages and modifications will readily appear to those skilled in the art. Therefore, the invention, in its broadest aspects is not limited to the specific details, the representative apparatus, and illustrative examples shown and described. Accordingly, departures may be made from such details without departing from the spirit or scope of the applicant's general inventive concept.

We claim:

1. A memory card apparatus for adding parity to a non-parity computer system, the memory card apparatus comprising:

a) a memory card;
   b) a parity RAM, locatable on said memory card;
   c) logic for generating, checking and storing parity bits in said parity RAM;
   d) logic for controlling said logic for generating and checking parity bits; and
   e) an error indicator and logic for controlling and decoding said error indicator.

2. The memory card apparatus of claim 1 wherein said memory card is a SIMM.

3. The memory card apparatus of claim 1 wherein said error indicator further comprises a first error indicator to warn the system operator of error and a second error indicator to indicate the source of error.

4. The memory card apparatus of claim 3 wherein said first error indicator is a buzzer.

5. The memory card apparatus of claim 3 wherein said second error indicator is a plurality of LEDs.

6. The memory card apparatus of claim 3 wherein said second error indicator is a plurality of electro-mechanical switches.

7. The memory card apparatus of claim 3 wherein said second error indicator is a non-volatile colorstrip.

8. The memory card apparatus of claim 3 wherein said second error indicator is a remote indicator driven by an analog driver.

9. The memory card apparatus of claim 1 wherein said error indicator is a light emitting diode.

10. The memory card apparatus of claim 9 further comprising on-board serial EPROM for storing error information generated by said logic for generating and checking parity or ECC bits and said logic for controlling said logic for generating and checking parity or ECC bits.

11. The memory card apparatus of claim 1 wherein said memory card is a DIMM.

12. A memory card apparatus for adding parity to a non-parity computer system, the memory card apparatus comprising:

a) a memory card;
   b) a parity RAM locatable on said memory card;
   c) logic for generating, checking and storing parity bits in said RAM;
   d) logic for controlling the generating, checking and storing of parity bits in said parity RAM;
   e) first and second error indicators; and
   f) logic for controlling and decoding said error indicators.

13. The memory card apparatus of claim 12 wherein said memory card is a SIMM.

14. The memory card apparatus for claim 12 wherein said first error indicator is a buzzer.

15. The memory card apparatus of claim 14 wherein said second error indicator further comprises a plurality of LEDs.

16. The memory card apparatus of claim 12 wherein said second error indicator further comprises a plurality of electro-mechanical switches.

17. The memory card apparatus of claim 12 wherein said second error indicator is a non-volatile colorstrip.

18. The memory card apparatus of claim 12 wherein said second error indicator is a remote indicator driven by an analog driver.

19. A memory card apparatus for adding error correction code to a non-error correction code and non-parity system;
   a) a memory card;
   b) an ECC RAM locatable on said memory card;
   c) logic for generating and checking ECC in communication with said ECC RAM;
   d) logic for correcting errors in communication with said logic for generating, checking and storing ECC in said RAM;
   e) an error indicator in communication with said logic for checking ECC; and
   f) logic for controlling said error indicator.

20. The memory card apparatus of claim 19 further comprising a latching mechanism in communication with said error indicator wherein said latching mechanism remains active until a power on reset is activated.

21. The memory card apparatus of claim 20 wherein said error indicator is a light emitting diode.

22. The memory card apparatus of claim 20 wherein said error indicator is a buzzer.

23. The memory card apparatus of claim 20 wherein said error indicator is a non-volatile pop-up pin.

24. The memory card apparatus of claim 20 wherein said logic for correcting errors includes exclusive or gates.

25. The memory card apparatus of claim 20 wherein said error indicator is a non-volatile colorstrip.

26. The memory card apparatus of claim 20 wherein said error indicator is a remote connector driven by an analog driver.

* * * * *